United States Patent
Gallegos et al.

(10) Patent No.: US 9,070,674 B2
(45) Date of Patent: Jun. 30, 2015

(54) THROUGH-SILICON COAXIAL VIA STRUCTURE AND METHOD

(71) Applicant: Avago Technologies General IP (Singapore) Pte. Ltd., Singapore (SG)

(72) Inventors: Adam E. Gallegos, Fort Collins, CO (US); Thomas E. Cynkar, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/948,196

(22) Filed: Jul. 23, 2013

(65) Prior Publication Data

US 2015/0028470 A1    Jan. 29, 2015

(51) Int. Cl.
*H01L 23/52* (2006.01)
*H01L 23/498* (2006.01)

(52) U.S. Cl.
CPC ................................ *H01L 23/49811* (2013.01)

(58) Field of Classification Search
USPC .......... 257/621, 693, 698, 774, E21.597, 685, 257/686, 773, 776, 777, E25.006, E23.174
See application file for complete search history.

(56) References Cited

U.S. PATENT DOCUMENTS

| | | | |
|---|---|---|---|
| 6,720,245 B2 | 4/2004 | Stucchi et al. | |
| 7,443,030 B2 * | 10/2008 | Muthukumar et al. | 257/758 |
| 8,390,098 B2 * | 3/2013 | Matsui | 257/621 |
| 8,394,715 B2 | 3/2013 | Volant et al. | |

OTHER PUBLICATIONS

Soon Wee Ho et al.; High RF Performance TSV Silicon Carrier for High Frequency Application; 2008 Electronic Components and Technology Conference; pp. 1946-1952; 2008.
Kahn et al.; Through Silicon Via (TSV)-induced Noise Characterization and Noise Mitigation using Coaxial TSVs; Dept. of Computer science, Tufts University; pp. 1-7; 2009.

* cited by examiner

*Primary Examiner* — Jasmine Clark

(57) ABSTRACT

A silicon interconnect structure includes a peripheral outer via in a silicon substrate, a solid core inner via in the silicon substrate, the solid core inner via coaxial with the peripheral outer via to form a coaxial via structure, a metal interconnect stack formed over a first surface of the peripheral outer via and the solid core inner via, at least portions of the metal interconnect stack forming an electrical connection with the peripheral outer via and the solid core inner via, first contact pads on a surface of the metal interconnect stack, and second contact pads on an exposed surface of the peripheral outer via and the solid core inner via.

20 Claims, 9 Drawing Sheets

THROUGH-SILICON COAXIAL VIA STRUCTURE AND METHOD

BACKGROUND

A modern application specific integrated circuit (ASIC) must meet very stringent design and performance specifications. Two factors that influence the design and performance of an ASIC are power supply inductance and signal cross talk. Typically, it is desirable to minimize the inductance in the power supply network as well as reduce signal to signal cross talk in the signal distribution network. Minimizing inductance improves the impedance of the power distribution network, and increasing signal isolation reduces cross talk between signal paths. A modern ASIC is typically assembled into a package, which is then mounted to a structure, such as a printed circuit board, using one of a number of known mounting techniques. The ASIC package typically includes a signal distribution structure that is sometimes referred to as an interposer or interposer structure. The interposer structure is generally located between the ASIC chip and a package interconnect. The package interconnect generally includes a laminate core and one or more material layers on opposing sides of the core that include conductive traces and that are used to distribute power, to route signals and to provide ground connections for both power and signal connections. The package interconnect, sometimes referred to as the package substrate, is typically located between the interposer structure and the PCB to distribute power and signals between the interposer structure and the PCB. Due to the many power and signal connections in a modern ASIC, inductance between power supply and ground connections, and the cross talk between signal lines can easily become so large that it negatively affects the performance of the ASIC.

Therefore, it would be desirable to have a way of minimizing power supply inductance and minimize signal to signal cross talk in an ASIC.

SUMMARY

In an embodiment, a silicon interconnect structure comprises a peripheral outer via in a silicon substrate, a solid core inner via in the silicon substrate, the solid core inner via coaxial with the peripheral outer via to form a coaxial via structure, a metal interconnect stack formed over a first surface of the peripheral outer via and the solid core inner via, at least portions of the metal interconnect stack forming an electrical connection with the peripheral outer via and the solid core inner via, first contact pads on a surface of the metal interconnect stack, and second contact pads on an exposed surface of the peripheral outer via and the solid core inner via.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

A through-silicon coaxial via structure can be used in any application specific integrated circuit (ASIC) in which it is desirable to reduce inductive and capacitive coupling between signal connections and reduce power supply inductance in a power distribution network. Minimizing inductive and capacitive coupling between signals improves signal integrity by reducing cross talk between signal paths. The through-silicon coaxial via structure can be implemented in circuits having single-ended signals, or in circuits having differential signals. The through-silicon coaxial via structure will be described below as being implemented in an ASIC package. However, the through-silicon coaxial via structure can be implemented in any laminate structure such as a printed circuit (PC) board interconnect.

Figure 1:
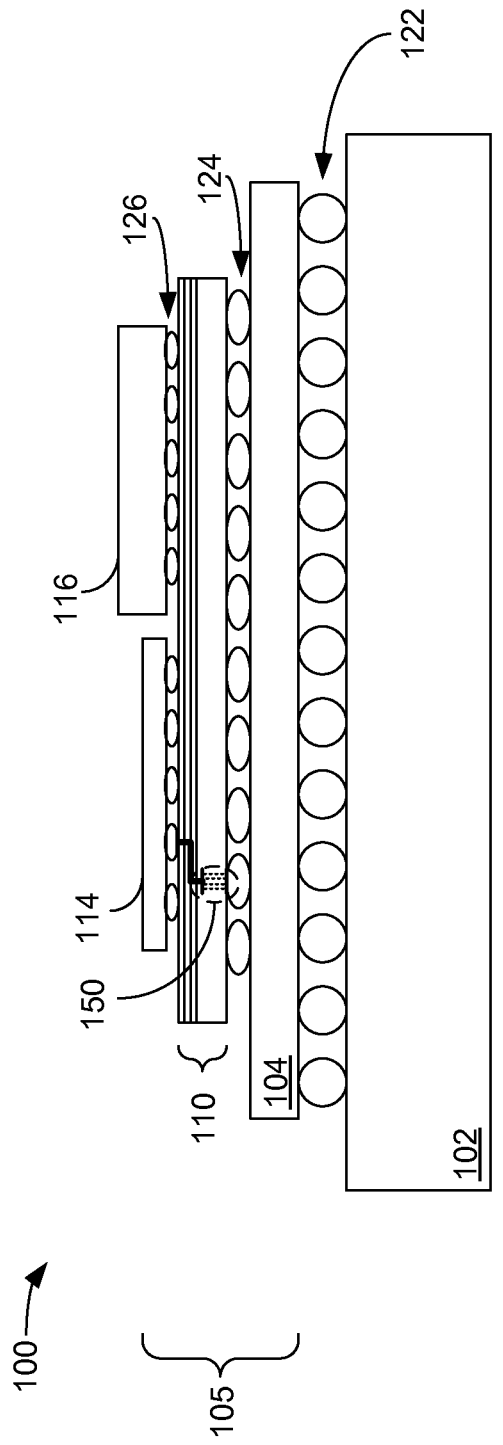
FIG. 1 is a schematic diagram illustrating a portion of an application specific integrated circuit (ASIC) assembly including an interposer structure having one or more coaxial via structures.

FIG. 1 is a schematic diagram illustrating a portion of an application specific integrated circuit (ASIC) assembly 100 including a through-silicon coaxial via structure. The assembly 100 comprises a printed circuit (PC) board 102 over which a circuit package 105 is located. The circuit package 105 can be attached to the PC board 102 using solder balls 122. An example of a circuit package 105 can be a DRAM package or another circuit package. Further, the circuit package 105 can be a flip-chip package, or another circuit package as known to those skilled in the art.

The circuit package 105 comprises a package substrate 104, an interposer structure 110, and one or more logic elements connected to the interposer structure 110. In an embodiment, the logic elements can include, for example, a logic die 114 and a memory die 116. Any integrated circuit element or ASIC chip can be part of the package 105, with the logic die 114 and a memory die 116 shown as non-limiting examples. The interposer structure 110 can be electrically and mechanically connected to the package substrate using solder bumps 124. The solder bumps 124 can be, for example, controlled collapse chip connection (C4) solder bumps, or any other solder bumps. The logic die 114 and a memory die 116 can be electrically and mechanically connected to the interposer structure 110 using micro-bumps 126. The use of solder bumps 124 and micro-bumps 126 is known to those having ordinary skill in the art.

The PC board 102 can be any single-layer or multi-layer structure used to mount a circuit package, such as the circuit package 105 as known in the art. The solder balls 122 are an example of an attachment structure that can be used to electrically and mechanically attach the circuit package 105 to the PC board 102, and are known to those skilled in the art. In an embodiment, the solder balls 122 can be arranged in what is referred to as a ball grid array (BGA).

The package substrate 104 generally comprises a core and one or more layers formed on one or both sides of the core. The package substrate 104 generally comprises a power distribution network (not shown) and signal distribution connections (not shown), sometimes referred to as circuit traces, which transfer power and signal connections between the PC board 102 and the interposer structure 110.

Similarly, the interposer structure 110 comprises a number of layers and electrical interconnections that distribute the connections form the solder bumps 124 to the micro-bumps 126.

Generally, the form factor and the array of micro-bumps 126 of the logic die 114 and a memory die 116 dictate that the connection to the PC board 102, and the array of solder balls 122, occur through an adaptive connection. The interposer structure 110 and, to an extent, the package substrate 104, serves this adaptive connection function of coupling the logic die 114 and a memory die 116 to the PC board 102, and distributing the connections between the logic die 114 and a memory die 116 and the PC board 102. The interposer structure 110 may also include one or more passages, referred to as "vias" that provide electrical connectivity between and among the various layers of the interposer structure 110. In an embodiment, the interposer structure 110 is fabricated using one or more layers of silicon and may include a bulk silicon substrate having one or more through-silicon coaxial via structures, an exemplary one of which is illustrated using reference numeral 150. The through-silicon coaxial via structure 150 will be described in greater detail below.

In the embodiment shown, the logic die 114 and a memory die 116 are located over the interposer structure 110 and a periphery of the logic die 114 and a memory die 116 is generally contained within the periphery of the interposer structure 110. Further, the interposer structure 110 is located over the package substrate 104, and a periphery of the interposer structure 110 is contained within a periphery of the package substrate 104. Further, the package substrate 104 is located over PC board 102, and a periphery of the package substrate 104 is generally contained within a periphery of the PC board 102.

FIGS. 2A through 2L are schematic diagrams illustrating an embodiment of a method for forming a through-silicon coaxial via structure. In the example shown in FIGS. 2A through 2L, the silicon substrate in which the through-silicon coaxial via structure is formed can be part of the interposer structure 110 (FIG. 1).

Figure 2A:
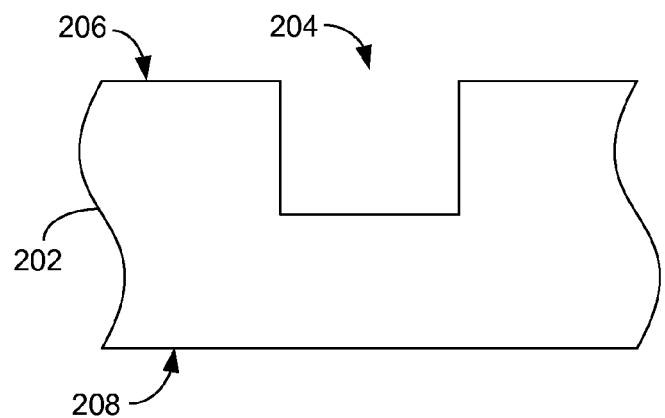
FIG. 2A is a schematic diagram illustrating an embodiment of a method for forming a through-silicon coaxial via structure.

In FIG. 2A, an opening 204 is formed in a silicon substrate 202. The silicon substrate 202 can be bulk silicon, a silicon wafer, or any other structure formed using silicon. The beginning thickness of the silicon substrate 202 can be, for example 785 μm. The processing to be described below is performed with a wafer having a typical beginning thickness of 785 μm. The processing and backside polish/grind that exposes the bottom of the through-silicon coaxial via structure and the conductors/insulators therein reduces the thickness to approximately 100 μm.

The silicon substrate 202 has a first surface 206 and a second surface 208. In one example, the first surface 206 can be considered a "top side" and the second surface 208 can be considered a "back side." However, the terms "top side" and "back side" are used for convenience of description and are not necessarily intended to convey top and bottom, but instead, are considered to be spatially invariant. The opening 204 can be a trench, a circular opening, or any other opening and can be formed by etching, milling, polishing, or any other process. In an embodiment, the opening 204 can be approximately 110 μm deep and approximately 10-12 μm wide (or 10-12 μm in diameter if formed as a circular opening).

Figure 2B:
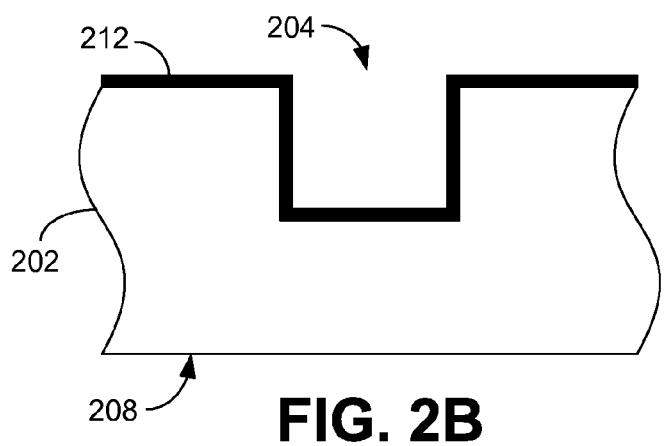
FIG. 2B is a schematic diagram illustrating an embodiment of a method for forming a through-silicon coaxial via structure.

In FIG. 2B, a first conformal oxide 212 can be formed, deposited, or otherwise applied to at least portions of the opening 204 and first surface 206. In an embodiment, the conformal oxide comprises tetra ethyl ortho silicate (TEOS), which functions as an insulating material, and can be deposited or otherwise applied to a thickness of approximately 1-2 μm. The first conformal oxide 212 can also be referred to as a "first insulator."

Figure 2C:
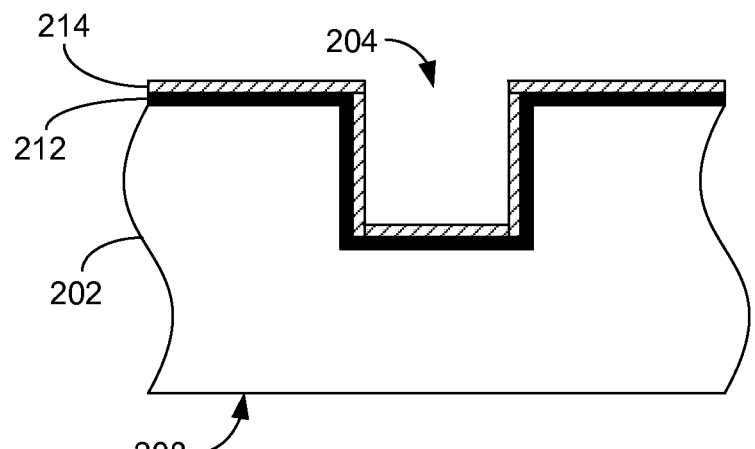
FIG. 2C is a schematic diagram illustrating an embodiment of a method for forming a through-silicon coaxial via structure.

In FIG. 2C, a first conformal conductor 214 can be formed, deposited, or otherwise applied to at least portions of the opening 204, over at least portions of the first conformal oxide 212. In an embodiment, the first conformal conductor 214 comprises a copper (Cu) seed layer and a conformal Cu layer topped with a thin barrier layer such as tantalum nitride (TaN), which functions as a conductor, and can be deposited or otherwise applied to a thickness of approximately 1 μm. The first conformal conductor 214 can also be referred to as a "first conductor."

Figure 2D:
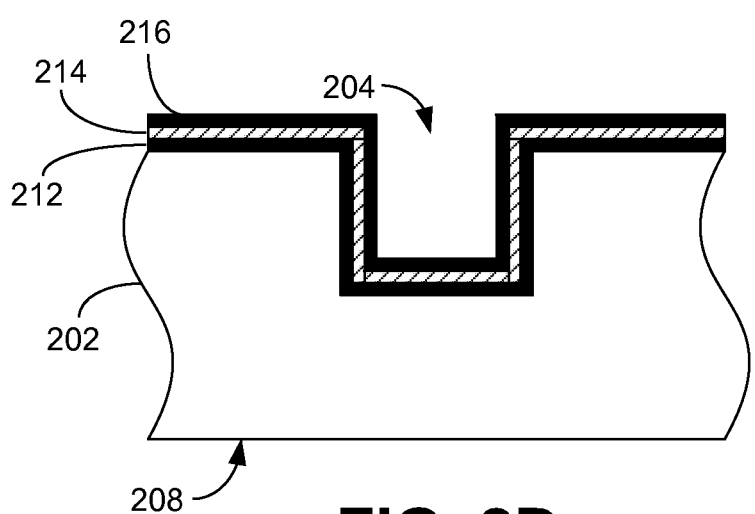
FIG. 2D is a schematic diagram illustrating an embodiment of a method for forming a through-silicon coaxial via structure.

In FIG. 2D, a second conformal oxide 216 can be formed, deposited, or otherwise applied to at least portions of the opening 204 and over at least portions of the first conformal conductor 214. In an embodiment, the second conformal oxide 216 comprises tetra ethyl ortho silicate (TEOS), which functions as an insulating material, and can be deposited or otherwise applied to a thickness of approximately 1-2 μm. The second conformal oxide 216 can also be referred to as a "second insulator."

Figure 2E:
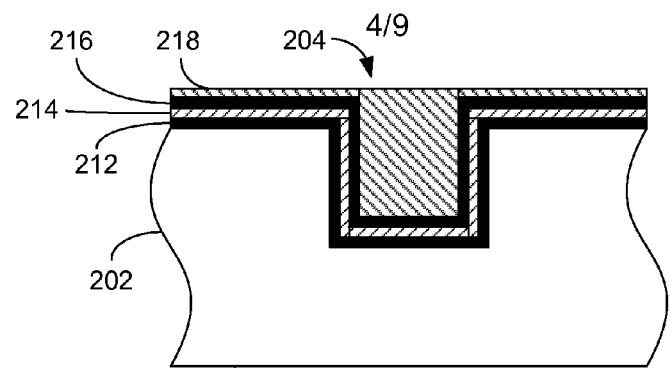
FIG. 2E is a schematic diagram illustrating an embodiment of a method for forming a through-silicon coaxial via structure.

In FIG. 2E, a second conductor 218 can be formed, deposited, or otherwise applied to completely fill the center of the opening 204, over the second conformal oxide 216. In an embodiment, the second conductor 218 comprises a Cu seed layer followed by a thick Cu layer, which will ultimately functions as a conductor, and can be deposited or otherwise applied to a thickness to adequately fill the trench (opening) 204. The second conductor 218 can be referred to as a "second conductor." In an embodiment, the second conductor 218 fills the opening 204.

Figure 2F:
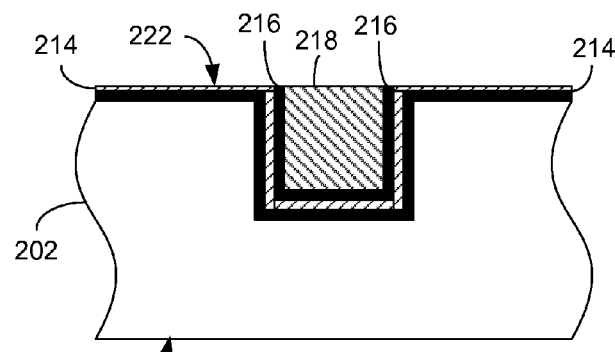
FIG. 2F is a schematic diagram illustrating an embodiment of a method for forming a through-silicon coaxial via structure.

In FIG. 2F, the surface of the material forming the second conductor 218 is polished to form a planarized surface 222. The polishing step completely removes the material of the second conductor 218 from the surface of the silicon substrate 202, leaving the second conductor 218 only in the opening 204. Additionally, the polishing step continues and removes the second conformal oxide 216 from the surface of the silicon substrate 202 to expose at least portions of the first conformal conductor 214, second conductor 218 and the second conformal oxide 216. The planarized surface 222 can be formed by, for example, chemical mechanical polishing (CMP) or any other process that can remove material and planarize a semiconductor surface having Cu and oxides at approximate thicknesses of 10-30 µm.

Figure 2G:
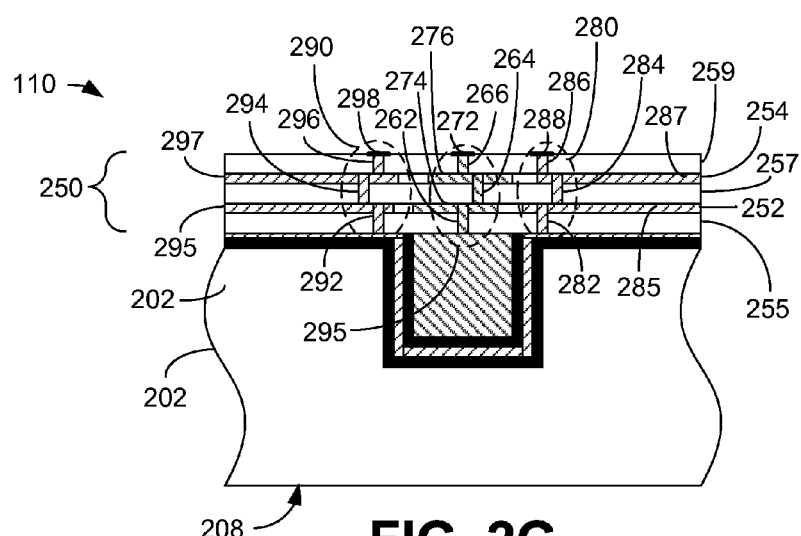
FIG. 2G is a schematic diagram illustrating an embodiment of a method for forming a through-silicon coaxial via structure.

In FIG. 2G, a metal interconnect stack 250 is formed over the planar surface 222. In an embodiment, the metal interconnect stack comprises alternating layers of conductive and non-conductive materials, which together with the silicon substrate 202, first conductor 214 and second conductor 216 form an embodiment of the interposer structure 110 (FIG. 1). For example, the metal interconnect stack 250 may comprise conductive layers 252 and 254 separated by non-conductive layers 255, 257 and 259. The metal interconnect stack 250 may also comprise conductive elements that connect the different conductive layers within the metal interconnect stack 250. Further, each of the conductive layers 252 and 254, and each of the non-conductive layers 255, 257 and 259 may be formed to include non-continuous layers, thus forming conductive structures within the metal interconnect stack 250.

As an example, a conductive structure 295 comprising conductive elements 262, 264 and 266 electrically connects the second conductor 218 to the contact pad 272 through portions 274 and 276, of conductive layers 252 and 254, respectively. In this manner, an electrical connection is created from the contact pad 272 to the second conductor 218.

A similar conductive structure 280 comprises conductive elements 282, 284 and 286 electrically connecting the first conductor 214 to the contact pad 288 through portions 285 and 287, of conductive layers 252 and 254, respectively. In this manner, an electrical connection is created from the contact pad 288 to the first conductor 214.

A similar conductive structure 290 comprises conductive elements 292, 294 and 296 electrically connecting the first conductor 214 to the contact pad 298 through portions 295 and 297, of conductive layers 252 and 254, respectively. In this manner, an electrical connection is created from the contact pad 298 to the first conductor 214.

The contact pads 298, 272 and 288 can be micro-bump contact pads formed by an aluminum metal layer, under bump metallurgy (UBM) and multi passivation layer openings, the details of which are known to those having ordinary skill in the art and which are omitted for simplicity of illustration. The micro-bumps can be applied to the logic die 114 and/or to the memory die 116 in a separate process.

Figure 2H:
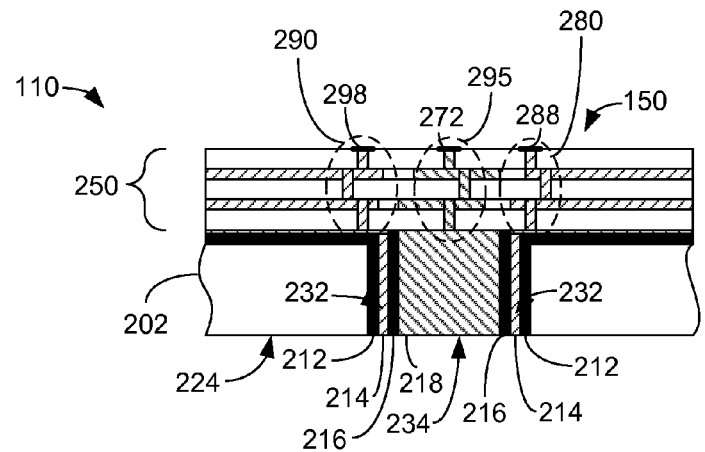
FIG. 2H is a schematic diagram illustrating an embodiment of a method for forming a through-silicon coaxial via structure.

In FIG. 2H, the second surface 208 is ground, etched, or otherwise removed to expose at least portions of the first conductor 214, second conductor 218, first conformal oxide 212 and the second conformal oxide 216. The planarized surface 224 can be formed by, for example, chemical mechanical polishing (CMP) or any other process that can planarize a semiconductor surface. In an embodiment, the second surface 208 can be ground using a two step process. A first step can be used to aggressively remove approximately 700 µm of relatively hard silicon, and a second step can be used to planarize the surface and expose the first conductor 214, second conductor 218, first conformal oxide 212 and the second conformal oxide 216, and arrive at the approximate 100 µm final thickness.

The structure in FIG. 2H shows a through-silicon coaxial via structure 150 in which the first conductor 214 forms a first via 232 and the second conductor 218 forms a second via 234. In an embodiment, the first via 232 can also be referred to as an outer via, and comprises a peripheral structure in that it can be annular in shape and can surround the second via 234, separated from the second via 234 by the second conformal oxide 216, which can also be annular in structure. In an embodiment, the second via 234 can be referred to as an inner via and comprises a solid core structure. In an embodiment, the second via 234 is electrically connected to the contact pad 272 through conductive structure 295, and the first via 232 is electrically connected to the contact pads 288 and 298 through the conductive structures 280 and 290, respectively.

Figure 2I:
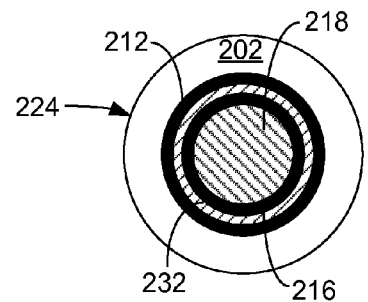
FIG. 2I is a schematic diagram illustrating an embodiment of a method for forming a through-silicon coaxial via structure.

FIG. 2I shows a plan view of the surface 224 illustrating the coaxial via structure. In FIG. 2H, the first via 232 forms a peripheral outer via which is separated from the second via 234 by the second conformal oxide 216.

Figure 2J:
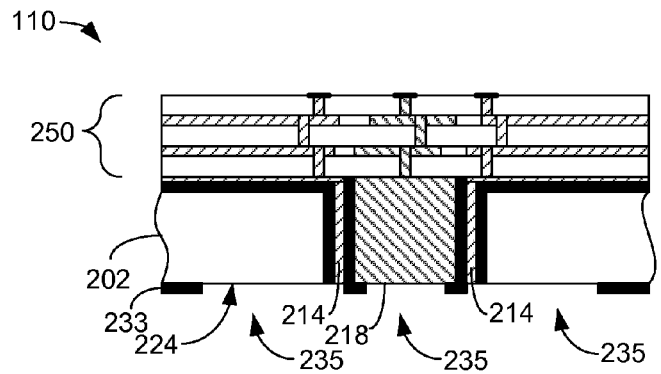
FIG. 2J is a schematic diagram illustrating an embodiment of a method for forming a through-silicon coaxial via structure.

In FIG. 2J, a layer of insulating material 233 is applied on the planarized surface 224 and selectively removed to create openings 235. The openings 235 can be created by etching or otherwise selectively removing the insulating material 233, or by selectively applying the insulating material 233 using a photoresist masking process.

Figure 2K:
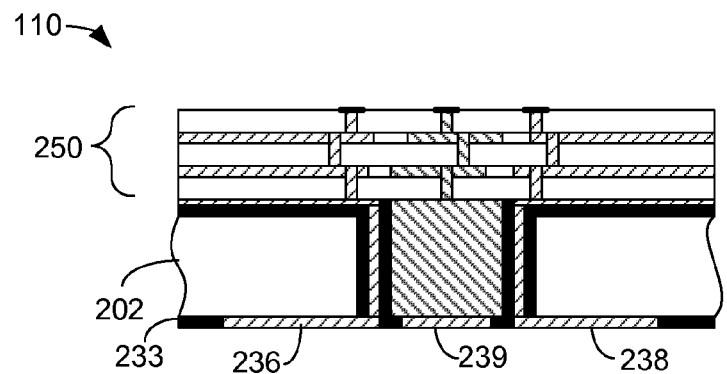
FIG. 2K is a schematic diagram illustrating an embodiment of a method for forming a through-silicon coaxial via structure.

In FIG. 2K, third conductors 236, 238 and 239 are formed in the openings 235 in electrical connection with the portions of the first conformal conductor 214 and second conductor 218 that form the first via 232 and the second via 234. In this manner, the portions of the first conductor 214 and the conductors 236 and 238 form the first via 232.

Figure 2L:
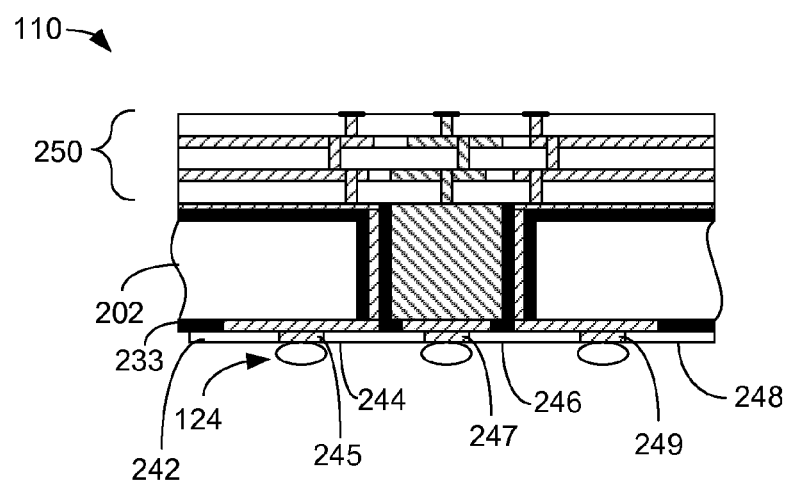
FIG. 2L is a schematic diagram illustrating an embodiment of a method for forming a through-silicon coaxial via structure.

In FIG. 2L, a non-conductive passivation material comprising a plurality of layer portions is applied to the back side surface 224. In this example, the passivation layer comprises insulator portions 242, 244, 246 and 248. The insulator portions 242, 244, 246 and 248 allow and/or define the formation of electrical contact pads (also referred to as under bump metal (UBM)) 245, 247 and 249 on the exposed surface of the third conductors 236, 239 and 238, respectively. The electrical contact pads 245 and 249 provide electrical connection to the first via 232, and the electrical contact pad 247 provides electrical connection to the second via 234. The C4 solder bumps 124 are applied to the electrical contact pads 245, 247 and 249 as shown.

Figure 3:
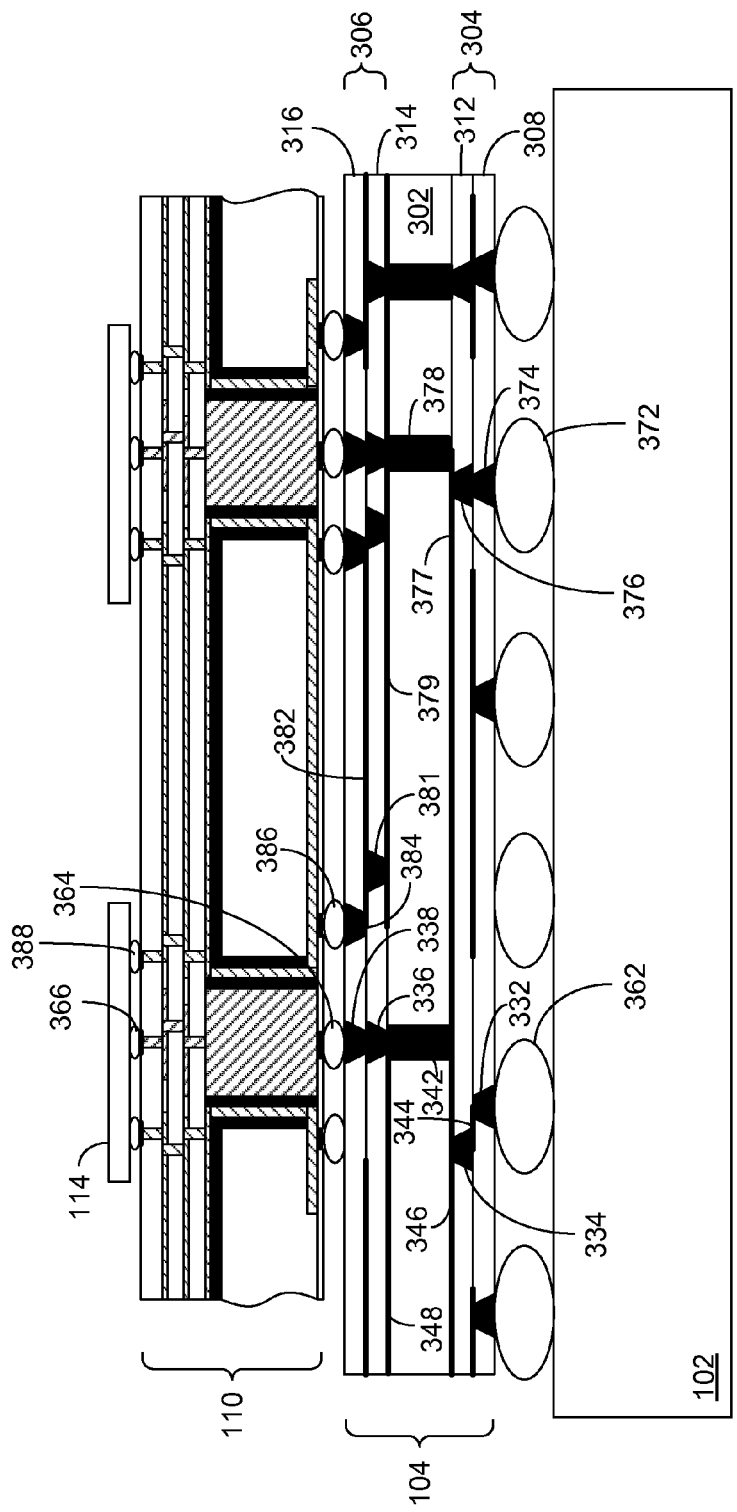
FIG. 3 is a schematic diagram illustrating a portion of the assembly of FIG. 1.

FIG. 3 is a schematic diagram illustrating a portion 300 of the assembly 100 of FIG. 1. The portion 300 generally comprises portions of the PCB 102, package substrate 104, interposer structure 110, logic die 114 and memory die 116.

The package substrate 104 generally comprises a laminate core 302 and layers 304 and 306. For example purposes only, the laminate core 302 can be fabricated from a glass fiber material, or another suitable material known to those skilled in the art. For exemplary purposes only, the layers 304 comprise individual layers 308 and 312, and the layers 306 comprise individual layers 314 and 316. The layers 304 and 306 are illustrated as each comprising two layers, sometimes referred to as "build-up" layers, but those skilled in the art will recognize that layers 304 and 306 may comprise more or fewer layers, and may each comprise a different number of layers. The layers 304 and 306 generally include a combination of non-conductive high density build-up material and material used to construct electrical interconnects including, but not limited to, copper, or other conductive material circuit traces, or other conductive material circuit pads, and other conductive elements and structures. For example only, the layers 304 and 306 may comprise conductive layers and/or conductive elements such as conductive elements 332, 334, 336 and 338. The layers 304 and 306 may comprise one or more conductive layers, such as conductive layers or conductive layer portions 344, 346 and 348. The laminate core 302 may comprise one or more conductive elements, such as a via 342. In this example, the conductive elements 332, 334, 336 and 338; the conductive layer portions 344, 346 and 348; and the via 342 comprise an electrical connection connecting the BGA ball 362 to the solder bump 364.

Similarly, in this example, the conductive elements 374, 376, 381 and 384; the conductive layer portions 377, 379 and 382; and the via 378 comprise an electrical connection connecting the BGA ball 372 to the solder bump 386. The through-silicon coaxial via structure 150 (FIG. 2H) electrically connects the solder bump 364 to the micro-bump 366, and connects the solder bump 386 to the micro-bump 388 thus forming two separate illustrative electrical connections between the logic die 114 and the PCB 102 using the through-silicon coaxial via structure. Many hundreds or thousands of such connections are possible.

Figure 4A:
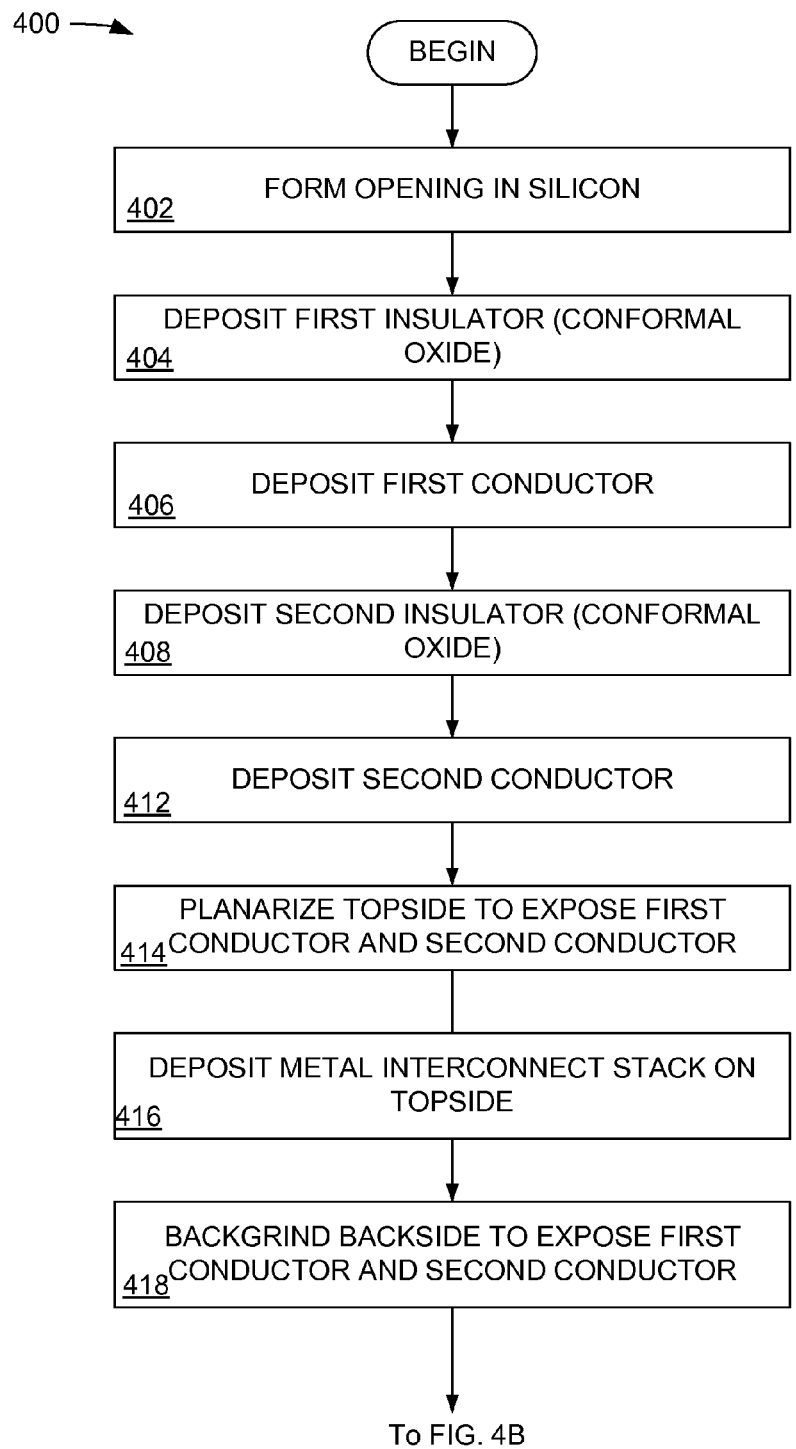
FIG. 4A is a flow chart of a method for forming a through-silicon coaxial via structure.
Figure 4B:
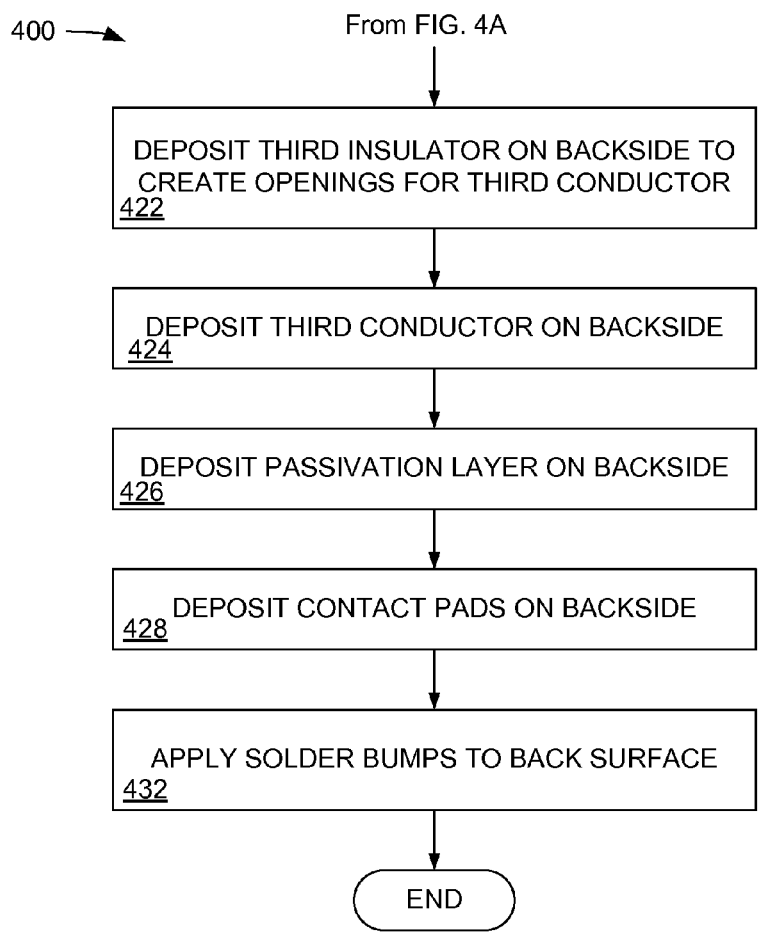
FIG. 4B is a flow chart of a method for forming a through-silicon coaxial via structure.

FIGS. 4A and 4B collectively show a flow chart of a method for forming a through-silicon coaxial via structure.

In block 402, an opening 204 is formed in a silicon substrate 202. The silicon substrate can be bulk silicon, a silicon wafer, or any other structure formed using silicon.

In block 404, a first conformal oxide 212 can be formed, deposited, or otherwise applied to at least portions of the opening 204 and first surface 206.

In block 406, a first conformal conductor 214 can be formed, deposited, or otherwise applied to at least portions of the opening 204, over at least portions of the first conformal oxide 212.

In block 408, a second conformal oxide 216 can be formed, deposited, or otherwise applied to at least portions of the opening 204, over at least portions of the first conformal conductor 214.

In block 412, a second conductor 218 can be formed, deposited, or otherwise applied to at least portions of the opening 204, over at least portions of the second conformal oxide 216.

In block 414, the surface of the second conformal insulator 218 is planarized to expose at least portions of the first conformal conductor 214, second conductor 218 and the second conformal oxide 216.

In block 416, a metal interconnect stack 250 is formed over the planar surface 222. In an embodiment, the metal interconnect stack 250 comprises alternating layers of conductive and non-conductive materials, together with the silicon substrate 202, first via 232 and second via 234 forming an embodiment of the interposer structure 110 (FIG. 1).

In block 418, the second surface 208 is ground, etched, or otherwise removed to expose at least portions of the first conformal conductor 214, second conductor 218, first conformal oxide 212 and the second conformal oxide 216.

In block 422, a non-conductive passivation material layer is applied to the back side surface 224. In this example, the non-conducting material comprises comprising insulator portions 242, 244, 246 and 248. The insulator portions 242, 244, 246 and 248 create openings for formation of a third conductor.

In block 424, third conductors 236, 238 and 239 are formed on the back side surface 224.

In block 426, a passivation layer comprising insulator portions 242, 244, 246 and 248 is formed on the back side surface 224.

In block 428, electrical contact pads 245, 247 and 249 are formed over the exposed portions of the third conductors 236, 239 and 238. The electrical contact pads 245 and 249 provide electrical connection to the first via 232 and the electrical contact pad 247 provides electrical connection to the second via 234.

In block 432, solder bumps 124 are applied to the electrical contact pads 245, 247 and 249 on the back side of the interposer structure 110.

This disclosure describes the invention in detail using illustrative embodiments. However, it is to be understood that the invention defined by the appended claims is not limited to the precise embodiments described.

What is claimed is:

1. A silicon interconnect structure, comprising:
   a peripheral outer via in a silicon substrate;
   a solid core inner via in the silicon substrate, the solid core inner via coaxial with the peripheral outer via to form a coaxial via structure;
   a metal interconnect stack formed over a first surface of the peripheral outer via and the solid core inner via, at least portions of the metal interconnect stack forming an electrical connection with the peripheral outer via and the solid core inner via;
   first contact pads on a surface of the metal interconnect stack;
   second contact pads on an exposed surface of the peripheral outer via and the solid core inner via; and
   solder bumps and solder micro-bumps, the solder micro-bumps connecting the silicon interconnect structure to an integrated circuit and the solder bumps connecting the silicon interconnect structure to an integrated circuit package substrate.

2. The silicon interconnect structure of claim 1, wherein the coaxial via structure and the metal interconnect stack form a silicon interposer structure.

3. The silicon interconnect structure of claim 2, wherein the solder bumps are formed over the second contact pads.

4. The silicon interconnect structure of claim 3, wherein the solder bumps are C4 solder bumps.

5. The silicon interconnect structure of claim 1, wherein the silicon interconnect structure connects a plurality of integrated circuits to the integrated circuit package substrate.

6. The silicon interconnect structure of claim 1, wherein the metal interconnect stack comprises alternating layers of conductive and non-conductive material, the conductive material forming electrical connections through the metal interconnect stack.

7. The silicon interconnect structure of claim 1, further comprising a plurality of coaxial via structures, each having a solid core inner via and a coaxial peripheral outer via.

8. An integrated circuit package, comprising:
   a package substrate;
   a silicon interposer structure located over the package substrate, the silicon interposer structure comprising:
   a peripheral outer via in a silicon substrate;
   a solid core inner via in the silicon substrate, the solid core inner via coaxial with the peripheral outer via to form a coaxial via structure;
   a metal interconnect stack formed over a first surface of the peripheral outer via and the solid core inner via, at least portions of the metal interconnect stack forming an electrical connection with the peripheral outer via and the solid core inner via;
   first contact pads on a surface of the metal interconnect stack;
   second contact pads on an exposed surface of the peripheral outer via and the solid core inner via; and
   solder bumps and solder micro-bumps, the solder micro-bumps connecting the silicon interconnect structure to an integrated circuit and the solder bumps connecting the silicon interconnect structure to an integrated circuit package substrate.

9. The integrated circuit package of claim 8, wherein the solder bumps are positioned over the second contact pads.

10. The integrated circuit package of claim 9, wherein the solder bumps are C4 solder bumps.

11. The integrated circuit package of claim 8, wherein the silicon interposer structure connects a plurality of integrated circuits to the integrated circuit package substrate.

12. The integrated circuit package of claim 8, wherein the metal interconnect stack comprises alternating layers of conductive and non-conductive material, the conductive material forming electrical connections through the metal interconnect stack.

13. The integrated circuit package of claim 8, wherein the peripheral outer via is electrically connected to a plurality of electrical connections in the metal interconnect stack and the solid core inner via is electrically connected to a single electrical connection in the metal interconnect stack.

14. The integrated circuit package of claim 8, wherein the silicon interposer structure further comprises a plurality of coaxial via structures, each having a solid core inner via and a coaxial peripheral outer via.

15. An integrated circuit package, comprising:
    a silicon interposer structure comprising:
        a peripheral outer via in a silicon substrate;
        a solid core inner via in the silicon substrate, the solid core inner via being coaxial with the peripheral outer via to form a coaxial via structure;
        a metal interconnect stack positioned over a first surface of the peripheral outer via and the solid core inner via, where at least some portions of the metal interconnect stack form an electrical connection with the peripheral outer via as well as the solid core inner via;
    solder bumps connecting the silicon interposer structure to an integrated circuit package substrate; and
    solder micro-bumps connecting the silicon interposer structure to an integrated circuit.

16. The integrated circuit package of claim 15, further comprising:
    first contact pads on a surface of the metal interconnect stack.

17. The integrated circuit package of claim 16, further comprising:
    second contact pads on an exposed surface of the peripheral outer via and the solid core inner via.

18. The integrated circuit package of claim 17, wherein the silicon interposer structure connects a plurality of integrated circuits to the integrated circuit package substrate.

19. The integrated circuit package of claim 17, wherein the metal interconnect stack comprises alternating layers of conductive and non-conductive material, the conductive material forming electrical connections through the metal interconnect stack.

20. The integrated circuit package of claim 17, wherein the peripheral outer via is electrically connected to a plurality of electrical connections in the metal interconnect stack and the solid core inner via is electrically connected to a single electrical connection in the metal interconnect stack.

\* \* \* \* \*